Figure 1:
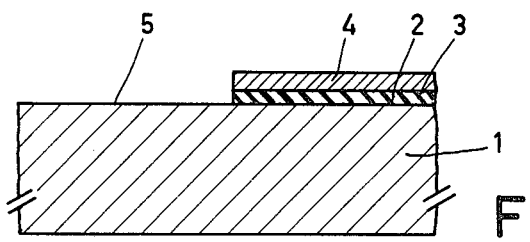

United States Patent [19]

Neukomm

[11] 4,293,588
[45] Oct. 6, 1981

[54] METHOD OF MANUFACTURING A SEMICONDUCTOR DEVICE USING DIFFERENT ETCH RATES

[75] Inventor: Hans-Rudolf Neukomm, Thalwil, Switzerland

[73] Assignee: U.S. Philips Corporation, New York, N.Y.

[21] Appl. No.: 71,226

[22] Filed: Aug. 30, 1979

Related U.S. Application Data

[63] Continuation of Ser. No. 914,750, Jun. 12, 1978, abandoned.

[30] Foreign Application Priority Data

Jun. 21, 1977 [NL] Netherlands ............ 7706802

[51] Int. Cl.³ .................. B05D 5/12; B44C 1/22; C03C 15/00; C03C 25/06; H01L 21/95
[52] U.S. Cl. .................... 427/93; 156/643; 156/646; 156/657; 204/192 E
[58] Field of Search ......... 156/643, 646, 653, 657, 156/662; 204/192 E; 29/571, 580; 252/79.1; 427/93-95

[56] References Cited

U.S. PATENT DOCUMENTS

| | | | |
|---|---|---|---|
| 3,880,684 | 4/1975 | Abe ............................ 252/79.1 |
| 3,958,040 | 5/1976 | Webb .......................... 427/94 |
| 3,997,367 | 12/1976 | Dy Yau ...................... 148/1.5 |
| 4,111,724 | 9/1978 | Ogiue et al. .............. 156/643 X |

*Primary Examiner*—William A. Powell
*Attorney, Agent, or Firm*—Thomas A. Briody; Robert T. Mayer; Steven R. Biren

[57] ABSTRACT

A method of manufacturing a semiconductor device is disclosed in which a surface of a silicon body is provided successively with a silicon oxide layer and silicon nitride layer. Parts of the surface are exposed and are subjected to an oxidation treatment so as to obtain a sunken oxide pattern, during which treatment an undesired small silicon nitride strip or "white ribbon" is formed, and remaining parts of the silicon nitride layer and the underlying silicon oxide layer are then etched away. In the etching treatment, silicon nitride is etched more rapidly than silicon oxide and silicon, while silicon nitride is etched at approximately the same rate as silicon, so that the undesired "white ribbon" is removed.

6 Claims, 5 Drawing Figures

METHOD OF MANUFACTURING A SEMICONDUCTOR DEVICE USING DIFFERENT ETCH RATES

This is a continuation, of application Ser. No. 914,750, filed June 12, 1978, now abandoned.

The invention relates to a method of manufacturing a semiconductor device in which a surface of a silicon body is provided successively with a silicon oxide layer and a silicon nitride layer, after which parts of the surface are exposed and are subjected to an oxidation treatment so as to obtain a sunken oxide pattern and parts of the silicon nitride layer and of the underlying silicon oxide layer which have remained are then etched away.

A method of the kind mentioned in the preamble is described in the publication by Kooi, van Lierop and Appels in "Journal Electrochemical Society", volume 123, pp. 1117-1120 (1976). It is elaborately described in that publication how, as a result of the oxidation with water vapor a small strip can be formed at the edge of the oxide pattern below the silicon nitride layer at the interface between the silicon oxide layer and the silicon body, which strip consists of silicon nitride. This strip is referred to as white ribbon ("white-ribbon"-effect).

When parts of the nitride and oxide layers which mask during the oxidation and have remained are then removed, for example, in order that the gate insulation of a MOS transistor can be formed in the exposed places of the silicon surface by oxidation, the possibility exists that at the area of the white ribbon too thin a gate oxide or no gate oxide at all is formed because the nitride of the white ribbon also masks against oxidation.

The white ribbon can be eliminated, for example, by etching in which the sunken oxide layer is often also removed partly. As will be explained hereinafter, a surface part is formed at the edge of the sunken silicon oxide pattern, which part is oriented differently with respect to the original surface and the surface remote from the edge of oxide pattern and which shows a different concentration $Q_{ss}$ of surface states. As a result of this, for example, the threshold value of a MOS transistor may differ considerably from the desired value.

One of the objects of the invention is to avoid the described problems at least to a considerable extent. The invention is based inter alia on the idea that a substantially flat silicon surface can be obtained by suitably etching the silicon nitride and silicon oxide layers.

Therefore, the method mentioned in the preamble is characterized according to the invention in that the etching treatment is carried out in circumstances in which silicon nitride is etched more rapidly than silicon oxide and silicon, and silicon oxide is etched approximately as rapidly as silicon.

In the method according to the invention, after the etching treatment, the orientation at the edge of the exposed surface part differs hardly or does not differ at all from the orientation of the original surface. The sunken oxide pattern need substantially not be attacked to remove the white ribbon.

In the method according to the invention, a part of the silicon surface exposed by the etching treatment is preferably provided with a layer of insulating material adjoining the sunken oxide pattern so as to obtain the gate insulation of a field effect transistor.

In this case it is of importance that the gate insulation be formed on a surface which is as flat as possible in order that the desired threshold value be reached.

As a surface is preferably chosen a (100) face.

The layers are preferably etched in an atmosphere which is obtained by means of a plasma. The advantage of such an etching method is that the etching of several layers can be carried out in one operational step.

The required etching rates are obtained in a comparatively simple manner when the plasma is maintained in a gas mixture containing oxygen and tetrafluoromethane.

The invention also relates to a semiconductor device obtained by using the method according to the invention.

The invention will now be described in greater detail with reference to the accompanying drawing and an embodiment.

Figure 2:
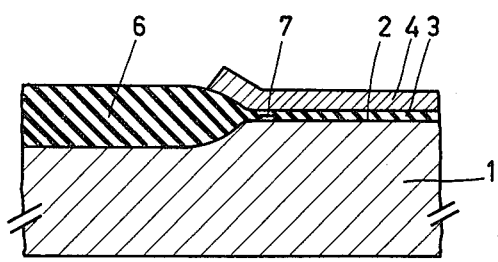
Figure 3:
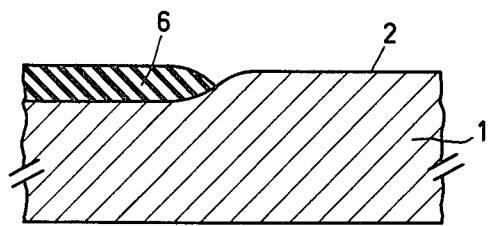
Figure 4:
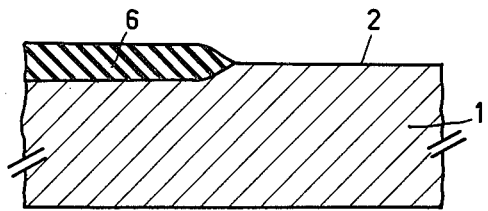
Figure 5:
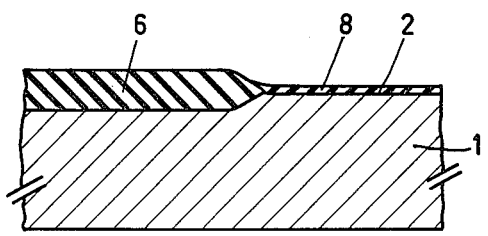

In the drawing:

FIGS. 1 to 3 are diagrammatic cross-sectional views of a part of a semiconductor device in successive stages of manufacture by means of a known method, and FIGS. 4 and 5 are diagrammatic cross-sectional views of a part of a semiconductor device in successive stages of the manufacture by means of the method according to the invention.

According to the illustrative embodiment, a semiconductor device is manufactured in which a surface 2 of a silicon body 1 is provided successively with a silicon oxide layer 3 and a silicon nitride layer 4 (see FIG. 1). Parts 5 of the surface 2 are then exposed and are subjected to an oxidation treatment to obtain a sunken oxide pattern 6 (see FIG. 2). Remaining parts of the silicon nitride layer 4 and of the underlying silicon oxide layer 3 are then etched away.

When during the etching of the silicon oxide layer 3 the silicon body 1 is not attacked, the shape of the pattern 6 and the surface 2 as shown in FIG. 3 are easily obtained.

This shape becomes more pronounced as the etching process lasts longer, for example, when a silicon nitride strip 7 formed during the oxidation has also to be removed. The surface 2 which is curved at the edge of the pattern 6 shows a concentration $Q_{ss}$ in surface states which differs from that of exposed parts of the surface remote from the edge.

According to the invention this is avoided to a considerable extent by performing the etching treatment so that silicon nitride is etched more rapidly than silicon oxide and silicon and silicon oxide is etched approximately as rapidly as silicon.

After etching, the surface 2 has a shape which is substantially flat also at the edge of the oxide pattern 6 (see FIG. 4).

A part of the silicon surface 2 exposed by the etching treatment may be provided with a layer 8 of insulating material adjoining the sunken oxide pattern 6 so as to obtain the gate insulation of a field effect transistor (see FIG. 5). As a result of the flat shape of the surface a concentration of surface states which is constant throughout the surface is obtained and hence a constant threshold value of the field effect transistor is achieved. If the curved surface shown in FIG. 3 were to be provided with a gate insulation layer, stray field effect transistors having different threshold values might be formed at the edge of the oxide pattern 6.

Many conventional techniques may be used for the manufacture of the semiconductor element according to the invention.

Preferably, a (100)-face is chosen for the surface 2 because faces having this orientation show the smallest concentration of surface states.

The layers 3 and 4 are provided on the body 1 in a usual manner in a shape which is reversed with respect to the pattern 6.

The oxidation treatment is preferably carried out in a water vapor atmosphere.

During the oxidation with water vapor, the silicon nitride strip 7 is formed and, when using known etching methods, the removal of said strip often gives rise to overetching of the oxide pattern 6, as explained with reference to FIG. 3.

The removal of remaining parts of the layers takes place by etching by means of a plasma. The plasma is maintained in a gas mixture containing oxygen and tetrafluoromethane.

The gas mixture contains, for example, from 4 to 50% by volume of $O_2$ and from 96 to 50% by volume of $CF_4$.

The gate insulation layer 8 may also be obtained in a known manner by oxidation with oxygen.

The further process steps to obtain a field effect transistor are the steps conventionally used in semiconductor technology. In the example described the gate insulation 8 is partly bounded by the oxide pattern 6 and partly by source and drain regions.

Of course the invention is not restricted to the embodiment described. It will be obvious that many variations are possible to those skilled in the art without departing from the scope of this invention.

The method according to the invention may also be used for the manufacture of integrated circuits having several field effect transistors with different threshold values, for example, of complementary field effect transistors.

What is claimed is:

1. A method of manufacturing a semiconductor device having a sunken oxide pattern, which comprises:
   providing a silicon body having a major surface;
   providing a silicon oxide layer on said surface;
   providing a silicon nitride layer on said oxide layer;
   removing like portions of said oxide and nitride layers to form a patterned oxidation mask which exposes selected areas of the surface;
   oxidizing said exposed areas of the surface to obtain a sunken oxide pattern in an oxidation step in which a small silicon nitride strip is formed beneath said nitride layer adjacent the edges of said patterned oxidation mask defining said sunken oxide pattern and at the interface between said oxide layer and the surface of said silicon body; and
   then removing said patterned oxidation mask to expose further areas of the surface adjacent the sunken oxide pattern by an etching treatment in which the silicon nitride layer is etched more rapidly than the silicon oxide layer and the silicon body material, the silicon oxide layer and the silicon body material are etched at approximately the same rate, and the small silicon nitride strip is removed, the exposed further areas of the surface being substantially flat at the edges of the oxide pattern.

2. A method as claimed in claim 1, wherein the surface is oxidized in a water vapor atmosphere.

3. A method as claimed in claim 1, further comprising the step of providing a layer of insulating material on said further areas of the major surface and adjoining said sunken oxide pattern to form a field effect transistor gate insulation layer.

4. A method as claimed in claim 1, in which the major surface is a (100)face.

5. A method as claimed in claim 1, wherein the etching treatment is conducted by means of a plasma.

6. A method as claimed in claim 5, wherein the plasma is maintained in a gas mixture comprising oxygen and tetrafluoromethane.

* * * * *